(12) United States Patent
Boyer

(10) Patent No.: US 6,347,389 B1
(45) Date of Patent: Feb. 12, 2002

(54) PIPELINED HIGH SPEED REED-SOLOMON ERROR/ERASURE DECODER

(75) Inventor: Keith G. Boyer, Thornton, CO (US)

(73) Assignee: Storage Technology Corporation, Louisville, CO (US)

( * ) Notice: Subject to any disclaimer, the term of this patent is extended or adjusted under 35 U.S.C. 154(b) by 0 days.

(21) Appl. No.: 09/274,406

(22) Filed: Mar. 23, 1999

(51) Int. Cl.[7] .............................................. H03M 13/15
(52) U.S. Cl. .................................................. 714/784
(58) Field of Search ........................................ 714/784

(56) References Cited

U.S. PATENT DOCUMENTS

| | | | | |
|---|---|---|---|---|
| 5,323,402 A | * | 6/1994 | Vaccaro et al. | 371/37.1 |
| 5,379,305 A | | 1/1995 | Weng | 371/41 |
| 5,430,739 A | | 7/1995 | Wei et al. | 371/37.1 |
| 5,541,937 A | * | 7/1996 | Iwamura | 371/37.1 |
| 5,942,005 A | * | 8/1999 | Hassner et al. | 714/784 |
| 6,119,262 A | * | 9/2000 | Chang et al. | 714/781 |
| 6,122,766 A | * | 9/2000 | Fukuoka et al. | 714/784 |
| 6,131,178 A | * | 10/2000 | Fujita et al. | 714/784 |

OTHER PUBLICATIONS

Blaum M. et al., "New Array Codes For Multiple Phased Burst Correction"; IEEE Transactions on Information Theory, US, IEEE Inc. New York, vol. 39, No. 1, 1993, pp. 66–77.

* cited by examiner

Primary Examiner—Stephen M. Baker
(74) Attorney, Agent, or Firm—Duft, Graziano & Forest; Wayne P. Bailey

(57) ABSTRACT

The pipelined high speed Reed-Solomon error/erasure decoder processes multiple code words in a pipelined fashion. The pipelined high speed Reed-Solomon error/erasure decoder is designed to process Reed-Solomon encoded words that have been corrupted in a digital system by processing errors as well as erasures through a simple iterative modified syndrome process. The iterative nature of this method provides for limited computational effort at each step of the pipeline. This allows the pipelined high speed Reed-Solomon error/erasure decoder to easily handle full or shortened Reed-Solomon codes, as well as parallel processing to achieve higher data rates. The iterative modified syndrome process is one of the pipelined steps. It relieves the erasure pre-shifting burden from the Berlekamp/Massey synthesis process, which reduces the number of cycles required at that stage of processing. The decoder proceeds classically with a Chien Search for any remaining error locations. This approach allows the pipelined high speed Reed-Solomon error/erasure decoder to relay early information on all error locations. The final stage of the decoding process is a parallel, iterative solution to Forney's equation for the calculation of the error magnitudes.

28 Claims, 4 Drawing Sheets

PIPELINED HIGH SPEED REED-SOLOMON ERROR/ERASURE DECODER

FIELD OF THE INVENTION

This invention relates to a system that decodes a class of multiple error correcting codes known as Reed-Solomon Codes, which are typically used within digital communication systems to detect corrupted data contained in the digital transmission and correct these corrupted data. As part of the Reed-Solomon error correcting process, redundancy is added to the transmitted data, such that upon receipt of a data transmission, the possibly corrupted data and redundancy are mathematically processed to correct the corrupted data in the data transmission.

Problem

It is a problem in high speed decoding of multiple error correcting codes, known as Reed-Solomon codes, with or without erasure pointers, to reduce the number of computational steps that are required at each stage of decoding. It is, likewise, a problem to reduce the number of combinatorial operations that are required to exchange data between any two hardware registers that are operational within the Reed-Solomon decoder.

Reed-Solomon Codes are used within digital communication systems, such as fiber optic transmission systems, optical and magnetic data storage systems, where the corruption of data being transferred between any two points affects system reliability. As part of the Reed-Solomon error correcting process, redundancy is added to the transmitted data, such that upon receipt of a data transmission the possibly corrupt data and redundancy are mathematically processed to correct errors in the data transmission. Prior art Reed-Solomon decoders use both Berlekamp/Massey and Chien Search processes to detect and correct the errors that are present in the data transmission. These prior art Reed-Solomon decoders are primarily concerned with the total number of computations required to perform the data transmission decoding process, and the amount of hardware required to perform the data transmission decoding process. The Berlekamp/Massey synthesis process includes an erasure pre-shifting burden which adds to the processing complexity. These prior art Reed-Solomon decoders typically lack explicit early indication of error locations and do not provide early erasure information from the Berlekamp/Massey and Chien Search processes.

Solution

The above described problems are solved and a technical advance achieved by the pipelined high speed Reed-Solomon error/erasure decoder of the present invention which processes multiple code words in a pipelined fashion. The piplelined high speed Reed-Solomon error/erasure decoder processes Reed-Solomon encoded data words to detect the presence of data words that have been corrupted in a digital system and processes corrupted data, that comprises both errors as well as erasures, through a simple iterative modified syndrome process. The iterative nature of this method provides for limited computational effort at each step of the pipeline. This allows the pipelined high speed Reed-Solomon error/erasure decoder to easily handle full or shortened Reed-Solomon codes, as well as parallel processing to achieve higher data rates. The iterative modified syndrome process is one of the pipelined steps. It relieves the erasure pre-shifting burden from the Berlekamp/Massey synthesis process, which reduces the number of cycles required at that stage of processing. The pipelined high speed Reed-Solomon error/erasure decoder then proceeds classically with a Chien Search for any remaining error locations. This approach allows the pipelined high speed Reed-Solomon error/erasure decoder to relay early information on all error locations. The final stage of the decoding process is a parallel, iterative solution to Forney's equation for the calculation of the error magnitudes.

This pipelined high speed Reed-Solomon error/erasure decoder emphasizes the number of iterations (or clock cycles) and the number of combinatorial operations between each hardware register, which is accomplished by combining iterative LFSR solutions for syndrome modification and error magnitude processing to the well known Berlekamp/Massey and Chien Search iterative hardware solutions. Additionally, in augmenting the known erasure locations with a classic Berlekamp/Massey—Chien Search for any remaining error locations, the pipelined high speed Reed-Solomon error/erasure decoder also provides explicit early indication of all error locations. This can be helpful in providing early erasure information for errors that no erasure location was provided.

DETAILED DESCRIPTION

Figure 1:
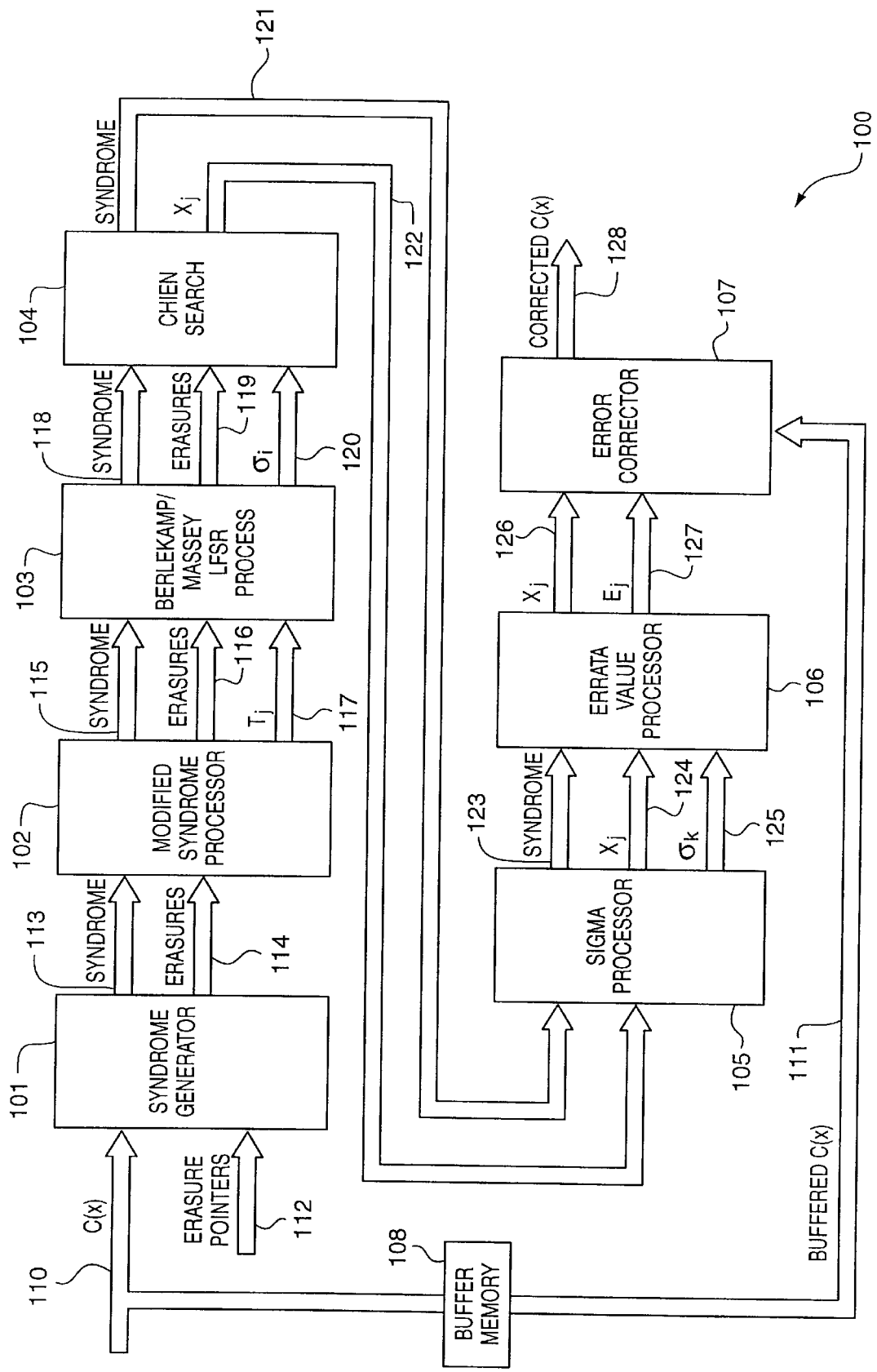
FIG. 1 illustrates in block diagram form the pipelined high speed Reed-Solomon error/erasure decoder of the present invention.

In the encoding of an (n, k) Reed-Solomon code, k data symbols are processed for each n–k=r redundancy symbols. The maximum number of symbols in the code word, which are developed by appending the k data symbols to the r redundancy symbols, is determined by the size of the Galois Field that the Reed-Solomon code is based on. This finite field, known as GF $(2^m)$, is defined by a primitive polynomial with order $n=2^m-1$. Each redundancy symbol is an element $^i$ of the field GF $(2^m)$. The number of symbols in the data transmission data word that a code can correct is equal to the number of redundancy symbols (r). The minimum distance $d=r+1$ of a redundancy code defines the minimum number of symbols for which every possible code word must differ. Each redundancy symbol can be used mathematically to either find the location or the magnitude of a symbol in error. Consequently, it takes two redundancy symbols to both locate and correct a single error in the data transmission.

Philosophy of the Pipelined High Speed Reed-Solomon Error/erasure Decoder

A Reed-Solomon decoder should handle corrupted data that comprises both erasures and errors to be effective in correcting data transmissions. When the location of corrupted data is know by any means that is external to a decoding process, it is called an erasure (e), and when the location of corrupted data is not know to the decoding process it is referred to as an error (t). Considering the minimum distance (r) of the redundancy code, for (r) symbols to be corrected, the location of each corrupted data byte must be known. The gives a code constraint of (2t+e≦d−1) for an erasure/error correcting Reed-Solomon decoder.

The pipelined high speed Reed-Solomon error/erasure decoder 100 starts by calculating, in a syndrome generator 101, the partial syndromes of the received data word v(x)= c(x)+e(x), where c(x) is the encoded word made up of k data symbols and r redundancy symbols, and e(x) is the error word. Since c(x) is a multiple of the generator polynomial G(x), it drops out of the calculation of the partial syndromes, and the syndrome calculations become equivalent to evaluating the error polynomial at the roots of the generator polynomial G(x):

$$S_j = v(x)|x = a^i = e(x)|x = a^j = \sum_{i=1}^{2t} Y_i X_i^j$$

In the case where both errors and erasures are considered by the Reed-Solomon decoding process, the syndrome includes the transform for both the (t) errors and (e) erasures:

$$S_j = \sum_{i=1}^{t} Y_i X_i^j + \sum_{k=1}^{e} V_k U_k^j$$

With the (e) know erasure locations, the pipelined high speed Reed-Solomon error/erasure decoder 100 then seeks to find up to (t) remaining errors. This requires that the transform syndromes $S_j$ be modified by a modified syndrome processor 102 to factor out the effect of the (e) erasure locations. The (e) erasure locations are first used to form the coefficients of the associated erasure locator polynomial:

$$\sigma(X) = \prod_{i=1}^{e} (X + U_i)$$

These coefficients are then processed in an iterative fashion to create the remaining modified transform syndromes $T_j$.

$$T_j = \sum_{k=0}^{e} (-1)^k \sigma_k S_{j-k}; \; j = e+1, e+2, \ldots, d-1$$

The modified transform syndromes $T_j$ can then be used in the classic Berlekamp/Massey 103 and Chien Search 104 iterative solutions to again find up to (t) errors that remain in the data transmission. The (t) newly discovered error locations are combined with the original (e) erasure locations to form the entire explicit set of error locations $\{X_j\}$. The coefficients of the final error locator polynomial for this set of error locations are then constructed as before, except that the polynomial is created for (t+e) erasure and error locations.

$$\sigma(X) = \prod_{j=1}^{(v=t+e)} (X + X_j)$$

The coefficients of σ(X) are related to the erasure and error locations by the elementary symmetric functions $\sigma_{ji}$.

Together with the original syndromes, Forney's equation for the error magnitudes $\{E_j\}$ can be solved:

$$E_j = \frac{\sum_{i=0}^{v-1} \sigma_{ji} S_{v-i}}{\sum_{i=0}^{v-1} \sigma_{ji} X_j^{v-i}}, \text{ where } \sigma_{ji} = \sigma_i + X_j \sigma_{j(i-1)}$$

Many decoding circuits for Reed-Solomon codes consider erasure pointers, but as disclosed in U.S. Pat. No. 5,379,305 (Lih-Jyh Weng), the decoder modifies the original transform syndromes for (p+e) erasures according to assumed precalculated coefficients. The pipelined high speed Reed-Solomon error/erasure decoder 100 provides a simple recursive hardware solution to this problem. It is based on an iterative solution to the elementary symmetric functions related to σ(X). This solution shifts recursively for each known erasure location, according to the recursion:

$$\sigma_i(x) = \sigma_{i-1} + X_i \sigma_{i-1},$$

where $\sigma_0(x) = 1$.

The recursion shifts to the highest possible order, shifting with zero for any missing erasure locations. In this way, the circuit always has the least significant coefficient ($\sigma_0 = 1$) in the same significant position, regardless of the number of erasure locations presented. Additionally, the pipelined high speed Reed-Solomon error/erasure decoder 100 provides a parallel hardware solution that shifts the original syndromes in a barrel shift fashion for each modified syndrome, according to the aforementioned equation for $T_j$.

Similarly, the process of determining the error magnitudes requires the coefficients of the combined error locator polynomial σ(X). In the iterative solution of the above-noted U.S. Pat. No. 5,379,305, these coefficients are again needed. The pipelined high speed Reed-Solomon error/erasure decoder 100, again, solves the above recursion for $\sigma_i(X)$. Then as a natural extension of this recursion, applies a similar hardware shift register approach to the coefficients required in the numerator and denominator of Forney's solution for the error magnitudes $\{E_j\}$:

$$\sigma_{ji} = \sigma_i + X_j \sigma_{j(i-1)}$$

The coefficients are retained in a shift register during the generation of the numerator, and used in a similar fashion to generate the denominator. The spirit of the pipelined high speed Reed-Solomon error/erasure decoder 100 differs from previous error evaluators such as that of U.S. Pat. No. 5,430,739 (Shyue-Win Wei, et al.). In this approach a parallel solution to determinants is used to solve the error evaluator problem. This requires fewer clock cycles, but greater combinatorial complexity between each hardware register stage.

DESCRIPTION OF THE PREFERRED EMBODIMENT

FIG. 1 depicts the complete pipelined high speed Reed-Solomon error/erasure decoder 100 with erasure capability. The first block comprises a buffer memory 108 that stores the code words of the received data transmission. These code words are also applied to the Syndrome Generator 101 which generates the transform syndromes according to:

$$S_j = v(x)|x = \alpha^j = e(x)|x = \alpha^j = \sum_{i=1}^{2t} Y_i X_i^j$$

This is a well known process, that yields (2t) syndrome values which are output on data path 113. The erasure pointers 112 are simply a digital indication that the code word symbol being received has been determined to contain an erasure location. This gives rise to the actual erasure locations 114 being presented to the successive Modified Syndrome process 102.

The Modified Syndrome process 102 modifies the original (2t) syndromes according to the (e) erasure locations, producing up to (2t) modified syndromes $\{T_j\}$, depending on the number of erasure locations, which are output on data path 117. Any unnecessary modified syndromes are padded with zeros as they are passed to the Berlekamp/Massey LFSR process 103. The Berlekamp/Massey process 103 creates an error locator polynomial that represents the (t) error locations that remain in the data transmission, beyond the (e) known erasure locations. The coefficients of this polynomial are represented by the set $\{\sigma_i\}$ which is passed on data path 120. The Berlekamp/Massey process 103 also retains the original syndromes and erasure locations passed to it. These are passed on data paths 118 and 119, respectively, to the following Chien Search process 104, where the roots of the error locator polynomial representing the (t) errors are found. The (t) error locations are then concatenated, by the Chien Search process 104, to the original (e) erasure locations. The result is the entire set of corrupted data locations $\{X_j\}$ which are output on data path 122. The Berlekamp/Massey process 103 and Chien Search process 104 are not discussed in detail in this embodiment due to fact that they are well documented in the literature.

Together with the original syndromes, the entire set of corrupted data locations $\{X_j\}$ are sent on data paths 121, 122, respectively to the Sigma Processor 105. Here the corrupted data locations are used to create the coefficients of the associated corrupted data locator polynomial $\{\sigma_k\}$. These coefficients, together with the original syndromes and the full set of corrupted data locations $\{X_j\}$ are sent on data paths 123. 124, 125, respectively, to the Errata Value Processor 106, where an associated error magnitude $\{E_j\}$ is created for each respective erasure and error location that corresponds to the corrupted data.

With all the corrupted data locations $\{X_j\}$ and corrupted data magnitudes $\{E_j\}$ defined and output on data paths 126, 127, respectively, the original corrupted code word C(x)=c(x)+e(x) is retrieved from buffer memory 108, used to buffer the associated pipelined delay of the pipelined high speed Reed-Solomon error/erasure decoder 100, and corrected in each location $X_j$ with the value $E_j$ by Error Corrector 107. The result is a corrected version of the corrupted code word C(x) output on data path 128.

Corrupted Data Locator Coefficient Generator (Sigma Processor)

Figure 2:
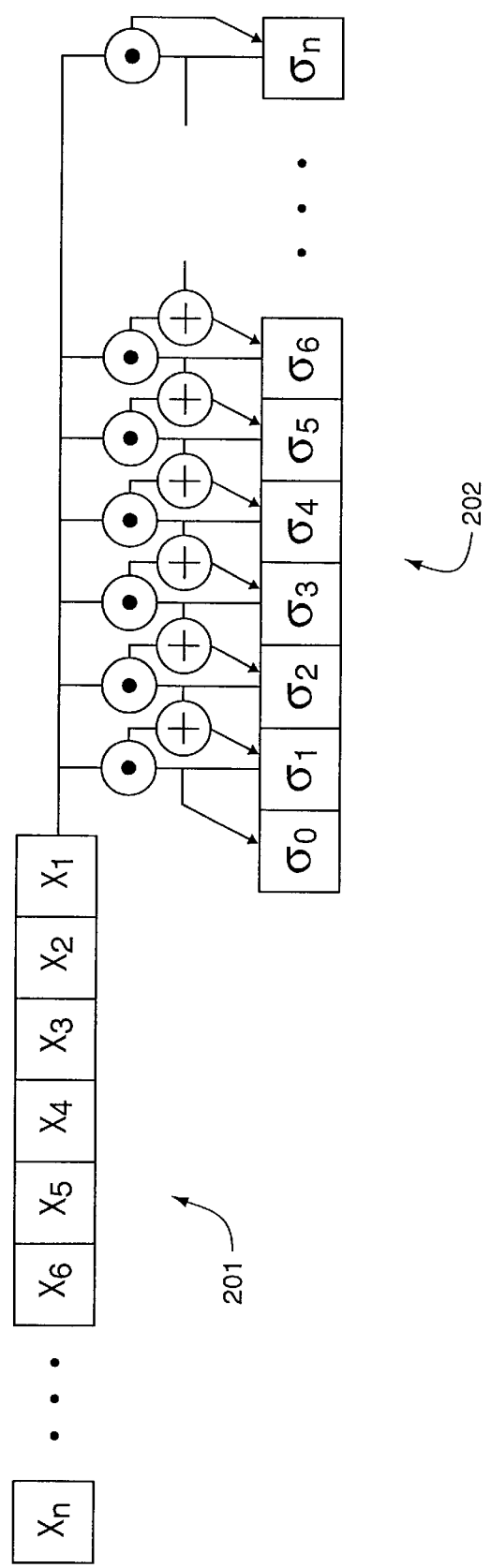
FIG. 2 illustrates in block diagram form the Error Locator Coefficient Generator (Sigma Processor)

In FIG. 2, the error location "X" register 201 of the corrupted data locator coefficient generator 200 is loaded with the set of error locations $\{X_j\}$, for either erasures and/or errors. The "σ" register circuit 202 is initialized with "$\alpha^0=1$" in the most significant position, $\sigma_n$, and zero in all other less significant register positions. The "σ" register circuit 202 is shifted until a "$\alpha^0=1$" appears in the $\sigma_0$ register position. This may mean that the "σ" register circuit 202 shifts for more cycles than there are available error locations. In this case, the error location register 201 simply shifts zeros into the σ construction. Ultimately, this corrupted data locator coefficient generator 200 is solving the recursion:

$$\sigma_i(X) = \sigma_{i-1} + X_i \sigma_{i-1},$$

where $\sigma_0(X)=1$.

This corrupted data locator coefficient generator 200 is used to provide corrupted data locator coefficients $\{\sigma\}$, for both the Modified Syndrome Processor 102 and the Sigma Processor 105 of FIG. 1.

Each finite field multiplier is denoted by a circle with a dot in the middle. Likewise, each finite field adder is denoted by a circle with an addition or "+" sign contained within. The addition is simple modulo 2, per bit, while the multiplication is the classic multiplication of two finite field values modulo g(x) (where g(x) is the primitive polynomial which defines the finite field GF ($2^m$).) These mathematical operations are defined the same throughout this document.

Modified Syndrome Processor

Figure 3:
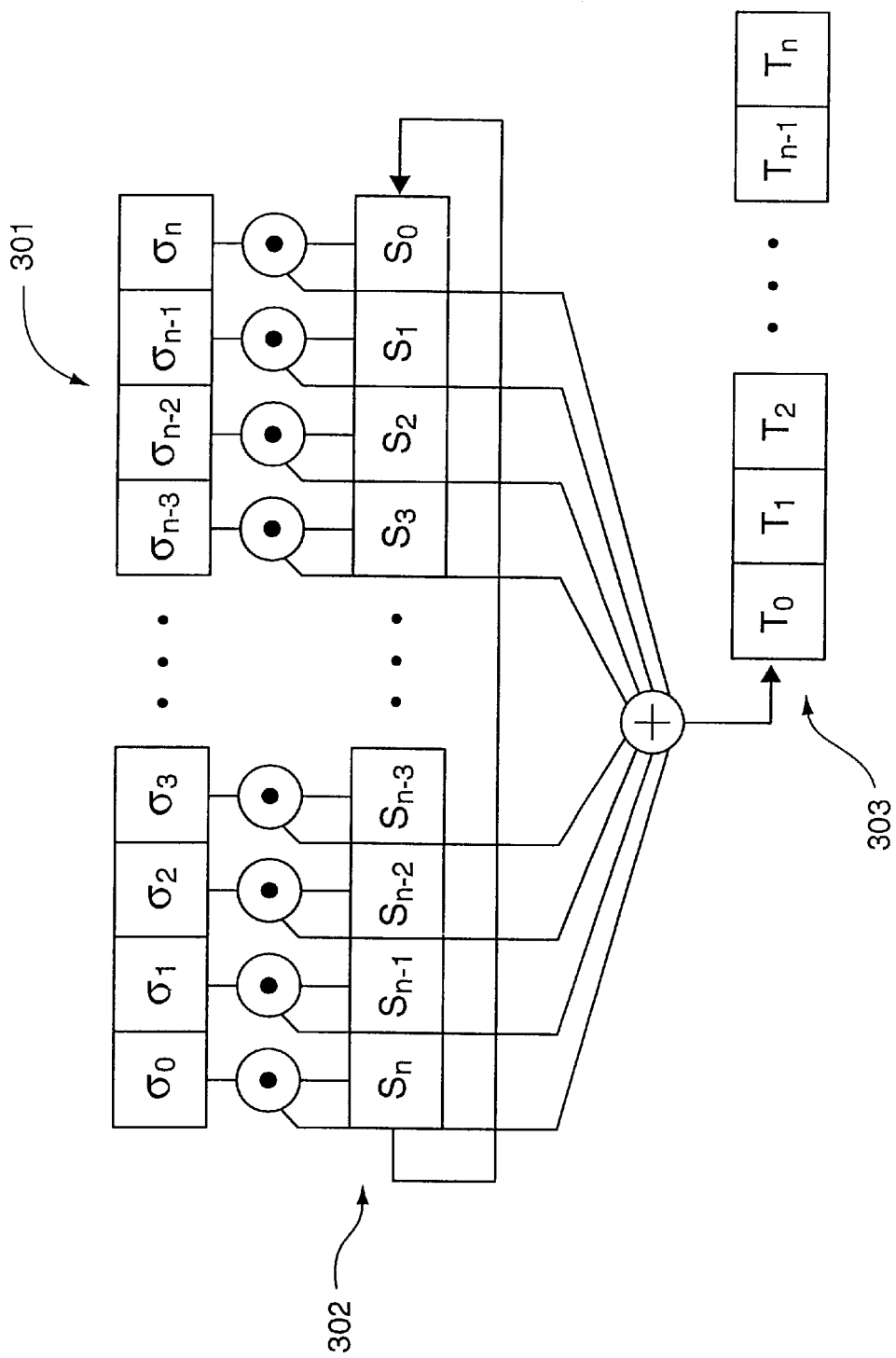
FIG. 3 illustrates in block diagram form the topology of the Modified Syndrome Processor hardware shift register.

FIG. 3 shows the topology of the Modified Syndrome Processor 102 hardware shift register of the pipelined high speed Reed-Solomon error/erasure decoder 100. In this circuit, the bank of a registers is the set of coefficients generated by the corrupted data locator coefficient generator 200. These coefficients are based on the set of erasure locations for which the original syndromes are to be modified. The original syndromes are modified according to the following equation:

$$T_j = \sum_{k=0}^{e} (-1)^k \sigma_k S_{j-k}; \quad j = e+1, e+2, \ldots, d-1$$

The register 302 having register positions denoted with "$S_n$" are loaded with the (2t) original syndromes. The order of polynomial in the "σ" register is (e+1), dictated by the number of erasures (e). The circuit shifts for each "j=e+1, e+2, d-1". For each clock cycle, the original syndrome register is shifted from right to left, and is shown to shift in an end around fashion only so that the original syndromes remain in the register and are not lost. On each cycle, a newly modified syndrome value is shifted into the register 303 having register positions denoted "$T_j$".

Ultimately, the Modified Syndrome Process 102 is comprised of generating the error locator coefficients associated with (e) erasures, and then using these coefficients to modify the original (2t) syndromes. The modified syndromes can then be used in a Berlekamp/Massey process 103 and Chien Search process 104 to find up to (t) remaining errors.

Error Magnitude Generator (Errata Value Processor)

Figure 4:
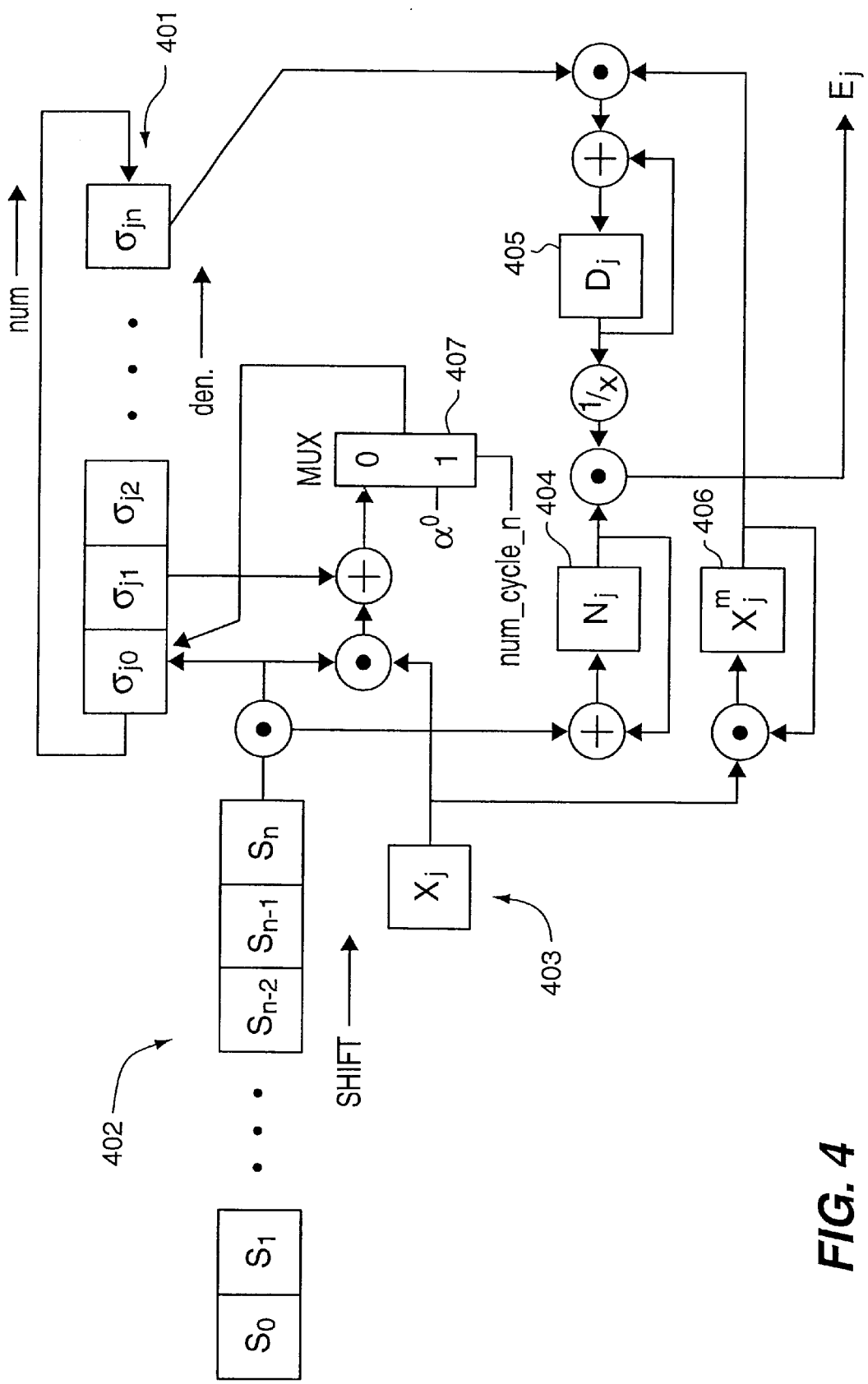
FIG. 4 illustrates in block diagram form the circuit construction of the Errata Value Processor for generating each of the error magnitudes.

FIG. 4 shows the circuit construction of the Errata Value Processor 106 for generating each of the error magnitudes $\{E_j\}$. The same circuit can be used to generate each of the (j=2t) possible error locations, or (2t) of these processors can be constructed so that all (=2t) possible error magnitudes can be calculated in parallel. In the parallel case, the syndrome register denoted "$S_i$" can be shared for all (2t) processors.

The first step in processing the error magnitudes is to generate the coefficients of the error locator polynomial $\{\sigma_k\}$ associated with the ultimate set of error locations $\{X_j\}$. These coefficients are, again, calculated using the Error Locator Coefficient Generator circuit of FIG. 2. These coefficients are then loaded into the $\sigma_{ji}$ register 401 of FIG. 4. The syndrome {S} register 402 is loaded with the original (2t) syndromes, and the {$X_j$} register 403 is loaded with the respective error location for the given error magnitude. The ($N_j$) numerator 404 and ($D_j$) denominator 405 registers are loaded with zero, while the $X_j^m$ register 406 is loaded with $\alpha^0=1$.

For the first (t) cycles, the $\sigma_{ji}$ registers shift left, while the $\sigma_{j0}$ register position gets the output of "Mux". The output of "Mux" 407 is the adder output until the last numerator shift (t=num_cycle_n), where the $\alpha^0=1$ result is shifted into the $\sigma_{j0}$ register position. Also, for each numerator (t) numerator cycles, the syndrome {$S_i$} register 402 is shifted right one position. This defines the numerator result ($N_j$), and the values $\sigma_{ji}$.

For the second (t) cycles, the $\sigma_{ji}$ registers shift right, and combine with the result of the $X_j^m$ register 403, which shifts together with ($D_j$) for each of the (t) denominator cycles. This defines the denominator result ($D_j$). After the (2t) cycles, the final result {$E_j$}=($Num_j$/$Den_j$) is accomplished via a combinatorial invert and multiply.

Summary

The pipelined high speed Reed-Solomon error/erasure decoder processes multiple code words in a pipelined fashion. The pipelined high speed Reed-Solomon error/erasure decoder processes Reed-Solomon encoded words that have been corrupted in a digital system. The pipelined high speed Reed-Solomon error/erasure decoder processes errors as well as erasures through a simple iterative modified syndrome process. The iterative nature of this processing method provides for limited computational effort at each step of the pipeline. This allows the pipelined high speed Reed-Solomon error/erasure decoder to easily handle full or shortened Reed-Solomon codes, as well as parallel processing to achieve higher data rates.

What is claimed:

1. A system for detecting and correcting both erasures and errors that are contained in a data transmission that includes multiple error correcting codes to identify said both erasures and errors, comprising:
   means for storing said data transmission;
   means, responsive to said data transmission, for generating syndrome data;
   means, responsive to said data transmission and said generated syndrome data, for generating location data representative of error and erasure locations in said data transmission;
   means, responsive to said generated syndrome data and said location data, for creating an associated error and erasure magnitude for each respective error and erasure location in said data transmission; and
   means, responsive to said location data, said error and erasure magnitudes, and said data transmission, for correcting each said both erasures and errors contained in said data transmission.

2. The system for detecting and correcting both erasures and errors that are contained in a data transmission of claim 1, further comprising:
   means for producing a digital indication that a code word symbol of said data transmission being received has been determined to contain an erasure; and
   means, responsive to said digital indication, for identifying locations of said erasure in said code word symbol.

3. The system for detecting and correcting both erasures and errors that are contained in a data transmission of claim 1, wherein said means for generating location data comprises:
   means for creating an error locator polynomial that represents said errors contained in said data transmission;
   means for determining roots of said error locator polynomial representing said errors; and
   means for creating data indicative of error locations of said error in said data transmission.

4. The system for detecting and correcting both erasures and errors that are contained in a data transmission of claim 3 wherein said means for creating an error locator polynomial comprises:
   means for executing a Berlekamp/Massey process to create said error locator polynomial that represents said errors contained in said data transmission.

5. The system for detecting and correcting both erasures and errors that are contained in a date transmission of claim 3 wherein said means for determining roots comprises:
   means for executing a Chien Search process to determine said roots of said error locator polynomial.

6. The system for detecting and correcting both erasures and errors that are contained in a data transmission of claim 3 wherein said means for creating data indicative of error locations comprises:
   means for executing a Sigma process on said roots of said error locator polynomial.

7. The system for detecting and correcting both erasures and errors that are contained in a data transmission of claim 1, wherein said means for correcting comprises:
   means for reading code words of said data transmission from said means for storing; and
   means for correcting each said both erasures and errors contained in said code words in said data transmission using said error and erasure location and a corresponding said error and erasure magnitude.

8. The system for detecting and correcting both erasures and errors that are contained in a data transmission of claim 1 wherein said means for generating syndrome data comprises:
   means for generating a set of syndrome data indicative of at least one erasure contained in said data transmission; and
   means for modifying said set of syndrome data to generate modified syndrome data indicative of at least one error contained in said data transmission.

9. The system for detecting and correcting both erasures and errors that are contained in a data transmission of claim 8 wherein said means for generating syndrome data further comprises:
   means for iteratively activating said means for generating a set of syndrome data and said means for modifying said set of syndrome data to correct a plurality of erasures and errors contained in said data transmission.

10. A method for detecting and correcting both erasures and errors that are contained in a data transmission that includes multiple error correcting codes to identify said both erasures and errors, comprising the steps of:
    storing said data transmission in a memory;
    generating, in response to said data transmission, syndrome data;
    generating, in response to said data transmission and said generated syndrome data, location data representative of error and erasure locations in said data transmission;

creating, in response to said generated syndrome data and said location data, an associated error and erasure magnitude for each respective error and erasure location in said data transmission; and correcting, in response to said location data, said error and erasure magnitudes, and said data transmission, each said both erasures and errors contained in said data transmission.

11. The method for detecting and correcting both erasures and errors that are contained in a data transmission of claim 10, further comprising the steps of:

producing a digital indication that a code word symbol of said data transmission being received has been determined to contain an erasure; and identifying locations of said erasure in said code word symbol.

12. The method for detecting and correcting both erasures and errors that are contained in a data transmission of claim 10, wherein said step of generating location data comprises:

creating an error locator polynomial that represents said errors contained in said data transmission;

determining roots of said error locator polynomial representing said errors; and creating data indicative of error locations of said error in said data transmission.

13. The method for detecting and correcting both erasures and errors that are contained in a data transmission of claim 12 wherein said step of creating an error locator polynomial comprises:

executing a Berlekamp/Massey process to create said error locator polynomial that represents said errors contained in said data transmission.

14. The method for detecting and correcting both erasures and errors that are contained in a data transmission of claim 12 wherein said step of determining roots comprises:

executing a Chien Search process to determine said roots of said error locator polynomial.

15. The method for detecting and correcting both erasures and errors that are contained in a data transmission of claim 12 wherein said step of creating data indicative of error locations comprises:

executing a Sigma process on said roots of said error locator polynomial.

16. The method for detecting and correcting both erasures and errors that are contained in a data transmission of claim 10, wherein said step of correcting comprises:

reading code words of said data transmission from said means for storing; and correcting each said both erasures and errors contained in said code words in said data transmission using said error and erasure location and a corresponding said error and erasure magnitude.

17. The method of detecting and correcting both erasures and errors that are contained in a data transmission of claim 10 wherein said step of generating syndrome data comprises:

generating a set of syndrome data indicative of at least one erasure contained in said data transmission; and modifying said set of syndrome data to generate modified syndrome data indicative of at least one error contained in said data transmission.

18. The method of detecting and correcting both erasures and errors that are contained in a data transmission of claim 17 wherein said step of generating syndrome data further comprises:

iteratively activating said step of generating a set of syndrome data and said step of modifying said set of syndrome data to correct a plurality of erasures and errors contained in said data transmission.

19. A system for detecting and correcting both erasures and errors that are contained in a data transmission that includes multiple error correcting codes to identify said both erasures and errors, comprising:

means for storing said data transmission;

means, responsive to said data transmission, for producing a digital indication that a code word symbol of said data transmission being received has been determined to contain an erasure;

means, responsive to said digital indication, for identifying locations of said erasure in said code word symbol;

means for generating data representative of error locations in said data transmission;

means for creating an associated error and erasure magnitude for each respective error and erasure location in said data transmission; and means, responsive to said error and erasure locations, said error and erasure magnitudes, and said data transmission, for correcting each said both erasures and errors contained in said data transmission, comprising:

means for reading code words of said data transmission from said means for storing; and means for correcting each said both erasures and errors contained in said code words in said data transmission using said error and erasure location and a corresponding said error and erasure magnitude.

20. The system for detecting and correcting both erasures and errors that are contained in a data transmission of claim 19, wherein said means for generating data comprises:

means for creating ah error locator polynomial that represents said errors contained in said data transmission;

means for determining roots of said error locator polynomial representing said errors; and means for creating data indicative of error locations of said error in said data transmission.

21. The system for detecting and correcting both erasures and errors that are contained in a data transmission of claim 20 wherein said means for creating an error locator polynomial comprises:

means for executing a Berlekamp/Massey process to create said error locator polynomial that represents said errors contained in said data transmission.

22. The system for detecting and correcting both erasures and errors that are contained in a data transmission of claim 20 wherein said means for determining roots comprises:

means for executing a Chien Search process to determine said roots of said error locator polynomial.

23. The system for detecting and correcting both erasures and errors that are contained in a data transmission of claim 20 wherein said means for creating data indicative of error locations comprises;

means for executing a Sigma process on said roots of said error locator polynomial.

24. A method for detecting and correcting both erasures and errors that are contained in a data transmission that includes multiple error correcting codes to identify said both erasures and errors, comprising the step of:

storing said data transmission in a memory;

producing, in response to said data transmission, a digital indication that the code word symbol of said data transmission being received has been determined to contain an erasure;

identifying locations of said erasure in said code word symbol;

generating data representative of error locations in said data transmission;

creating an associated error and erasure magnitude for each respective error and erasure location in said data transmission; and correcting, in response to said error and erasure locations, said error and erasure magnitudes, and said data transmission, each said both erasures and errors contained in said data transmission, comprising:

reading code words of said data transmission from said means for storing; and correcting each said both erasures and errors contained in said code words in said data transmission using said error and erasure location and a corresponding said error and erasure magnitude.

25. The method for detecting and correcting both erasures and errors that are contained in a data transmission of claim 24, wherein said step of generating data comprises:

creating an error locator polynomial that represents said errors contained in said data transmission;

determining roots of said error locator polynomial representing said errors; and creating data indicative of error locations of said error in said data transmission.

26. The method for detecting and correcting both erasures and errors that are contained in a data transmission of claim 25 wherein said step of creating an error locator polynomial comprises:

executing a Berlekamp/Massey process to create said error locator polynomial that represents said errors contained in said data transmission.

27. The method for detecting and correcting both erasures and errors that are contained in a data transmission of claim 25 wherein said step of determining roots comprises:

executing a Chien Search process to determine said roots of said error locator polynomial.

28. The method for detecting and correcting both erasures and errors that are contained in a data transmission of claim 25 wherein said step of creating data indicative of error locations comprises:

executing a Sigma process on said roots of said error locator polynomial.

* * * * *